United States Patent [19]
Yach

[11] Patent Number: 6,122,205
[45] Date of Patent: Sep. 19, 2000

[54] VOLTAGE REGULATOR AND BOOSTING CIRCUIT FOR READING A MEMORY CELL AT LOW VOLTAGE LEVELS

[75] Inventor: Randy L. Yach, Phoenix, Ariz.

[73] Assignee: Microchip Technology Incorporated, Tempe, Ariz.

[21] Appl. No.: 09/014,458

[22] Filed: Jan. 28, 1998

[51] Int. Cl.$^7$ ................................................... G11C 16/04
[52] U.S. Cl. ............... 365/189.66; 365/203; 365/185.18; 365/194
[58] Field of Search ......................... 365/189.06, 185.18, 365/189.11, 203, 194

[56] References Cited

U.S. PATENT DOCUMENTS 5,801,991  9/1998  Keeney et al. ...................... 365/185.18
5,815,445  9/1998  Hull et al. ........................... 365/189.06

Primary Examiner—Huan Hoang
Attorney, Agent, or Firm—Jeffrey D. Moy; Harry M. Weiss; Weiss & Moy, P.C.

[57] ABSTRACT

A system for reading a memory cell of a memory array at voltage levels lower than an erased threshold voltage of the memory array. The system uses a voltage regulator which is coupled to the memory array for charging a desired row of the memory array to a supply voltage. The voltage regulator is further used for clamping the desired row at a voltage level which is no higher than a maximum programmed threshold voltage of the memory array. The voltage regulator is able to perform these functions while consuming no DC current. A voltage booster is coupled to the voltage regulator and to the memory array. The voltage booster is used for raising the voltage level of the desired row to a voltage above the maximum erased threshold voltage of the memory cell. This allows the memory cell to be read at voltage levels which are lower than the threshold voltage of the memory array.

25 Claims, 1 Drawing Sheet

VOLTAGE REGULATOR AND BOOSTING CIRCUIT FOR READING A MEMORY CELL AT LOW VOLTAGE LEVELS

RELATED APPLICATIONS

This application is related to pending U.S. patent applications entitled "OVERCHARGE/DISCHARGE VOLTAGE REGULATOR FOR EPROM MEMORY ARRAY," Ser. No. 08/723,926 filed on Oct. 1, 1996, in the name of Hull et al., and assigned to the same assignee as this Application. The disclosures of the above referenced application is hereby incorporated by reference into this application.

BACKGROUND OF THE INVENTION

1. Field of the Invention

This invention relates generally to memory arrays and, more specifically, to a voltage regulator and booster circuit for reading memory cells of a memory array at supply voltages lower than the actual erased threshold voltage of the memory array.

2. Description of the Prior Art

Memory devices are fabricated using semiconductor process technology. As line widths are reduced in progression of the process technology, it may be desirable not only to design and fabricate entirely new versions of the products, but to "shrink" or scale existing products to smaller sizes with the new technology. This requires a review and analysis of the design and architecture of the product and the manner in which the attempted scaling of its size may adversely affect its operation.

In general, in order to read the data of a memory cell in a memory array, a measurement of the threshold voltage of the memory element is required. The memory cell is said to be erased if the threshold voltage of the memory cell is low, and to be programmed if the threshold voltage is high. The cell is read by applying a voltage to the control gate of a transistor comprising the memory cell. If the applied voltage is higher than the threshold voltage, current flows through the memory cell if it is erased, if no current flows, the memory cell is programmed. The programming margin of the memory cell is the voltage difference between the maximum applied control gate voltage and the programmed threshold voltage of the programmed memory cell. A programmed memory cell will not conduct current when read by application of a control gate voltage of a lower magnitude than the high threshold voltage of the memory cell.

In most implementations, the control gate voltage used to read the memory array is the supply voltage of the system. If the programmed threshold voltage of the memory cell is lower than the maximum value of the supply voltage, a programmed memory cell cannot be detected using the classic technique.

Scaling memory devices to smaller sizes has the effect of reducing the voltage range at which the memory devices operate. When a memory device is shrunk, the programmed threshold voltage of the memory cell is decreased and the effective programming margin is lowered. Furthermore, a smaller memory cell typically dictates a lower read current. The present invention arose from the necessity to scale a memory device (Erasable Programmable Read Only Memory (EPROM) semiconductor device) to a small geometry manufacturing process. The operating voltage for the semiconductor device being produced on the new manufacturing process is greater than the programming margin of a programmed memory cell of the memory device. Thus, the memory cells cannot be read with a full supply voltage because it will be read incorrectly.

One way to read memory cells at supply voltage levels lower than the actual threshold voltage of the memory array is to use a ring oscillator and a charge pump. The ring oscillator is an RC clock that generates a clock signal that pumps the row voltage greater than the supply voltage $V_{DD}$. The problem with using this approach is that the ring oscillator is only good for one voltage. Furthermore, this approach burns a lot of current. This is due to the fact that the ring oscillator is always pumping the row voltage higher each cycle. This causes further problems especially if the supply voltage is raised higher. If the supply voltage is raised higher, the ring oscillator may no longer be required to raise the row voltage of the memory array. In fact, if the ring oscillator continues to run, the row voltage may be raised to a voltage level that is too high. Since the memory cell of the memory array cannot be read with a full supply voltage, the memory cell will be read incorrectly.

Therefore a need existed to provide a voltage regulator and booster circuit for use with a memory array. The voltage regulator and booster circuit will allow the reading of memory cells in a memory array at voltage levels lower than the actual threshold voltage of the memory array. The voltage regulator and booster circuit will further allow a memory cell in the memory array to be read correctly even if the supply voltage $V_{DD}$ to the memory device may be at a level above the programmed margin of the memory cell. The voltage regulator and booster circuit is able to clamp the row voltage of a memory array at a value which is greater than an unprogrammed threshold voltage level of the memory cell and less than a programmed threshold voltage level of the memory cell thereby allowing reading of the memory cell at higher voltage levels. The voltage regulator and booster circuit must further be able to determine if the system is operating in a high voltage mode or a low voltage mode with a minimal amount of circuitry. The voltage regulator and booster circuit must also be able to automatically boost the row voltage of the memory array in the low voltage mode and shunt increases in row voltage levels to ground in a high voltage mode.

SUMMARY OF THE INVENTION

In accordance with one embodiment of the present invention, it is an object of the present invention to provide a voltage regulator and booster circuit for use with a memory array.

It is another object of the present invention to provide a voltage regulator and booster circuit which will allow the reading of memory cells in a memory array at voltage levels lower than the actual threshold voltage of the memory array.

It is still another object of the present invention to provide a voltage regulator and booster circuit allow a memory cell in the memory array to be read correctly even if the supply voltage $V_{DD}$ to the memory device may be at a level above the programmed margin of the memory cell.

It is yet another object of the present invention to provide a voltage regulator and booster circuit that is able to clamp the row voltage of a memory array at a value which is greater than an unprogrammed threshold voltage level of the memory cell and less than a programmed threshold voltage level of the memory cell thereby allowing reading of the memory cell at higher voltage levels.

It is still a further object of the present invention to provide a voltage regulator and booster circuit that is able to determine if the system is operating in a high voltage mode or a low voltage mode with a minimal amount of circuitry.

It is still a further object of the present invention to provide a voltage regulator and booster circuit that is able to determine if the system is operating in a high voltage mode or a low voltage mode and to automatically boost the row voltage of the memory array in the low voltage mode and shunt increases in row voltage levels to ground in a high voltage mode.

BRIEF DESCRIPTION OF THE PREFERRED EMBODIMENTS

In accordance with one embodiment of the present invention, a system for reading a memory cell of a memory array at voltage levels lower than a threshold voltage of the memory array is disclosed. The system uses a voltage regulator which is coupled to the memory array for charging a desired row of the memory array to be read to a supply voltage level. The voltage regulator is further used for clamping the desired row at a voltage level no higher than a minimum programmed threshold voltage of the memory cell. The voltage regulator is able to perform these functions while consuming no DC current. A voltage booster is coupled to the voltage regulator and to the memory array. The voltage booster is used for raising the voltage level of the desired row to a voltage level above the maximum erased threshold voltage level of the memory cell. This allows the memory cell to be read at voltage levels lower than the threshold voltage of the memory array.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
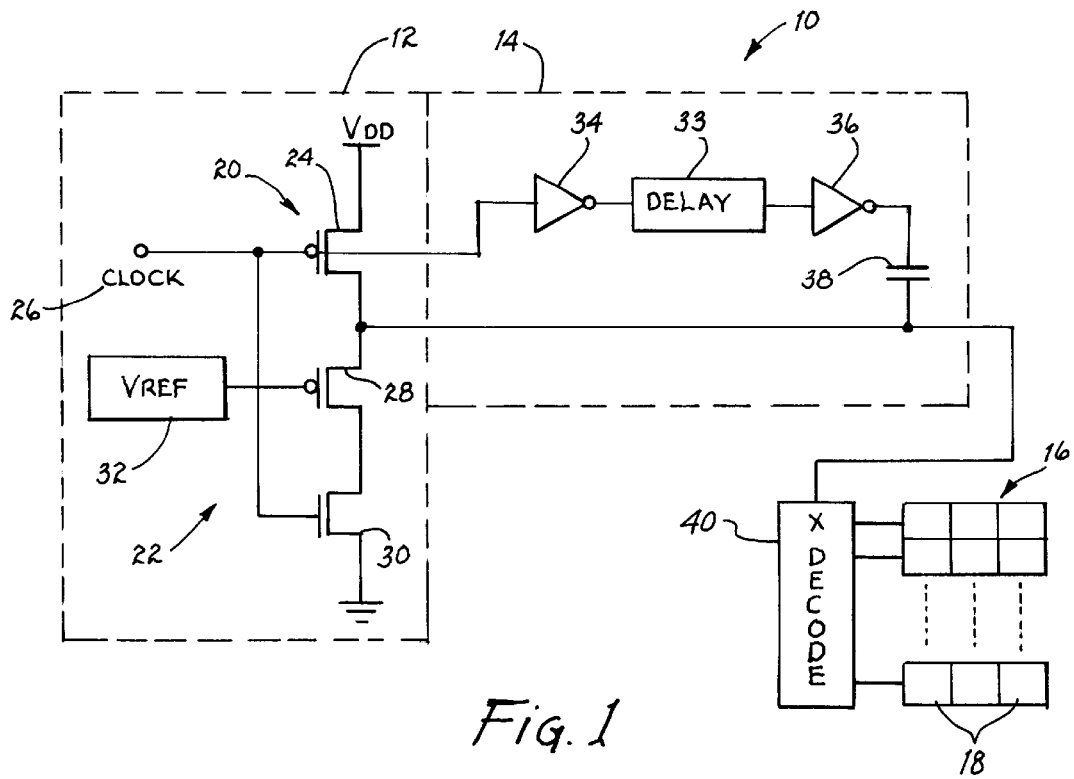
FIG. 1 is a simplified functional block diagram of the system for reading a memory cell of a memory array at voltage levels lower than the threshold voltage level of the memory array.

Referring to FIGS. 1 and 2, system for reading a memory cell of a memory array 10 (hereinafter system 10) is shown. The system 10 allows a memory cell to be read at voltage levels lower than the threshold voltage level of the memory array. The system 10 will further allow a memory cell in the memory array to be read correctly even if the supply voltage $V_{DD}$ to the memory device may be at a level above the programmed margin of the memory cell.

The system 10 is comprised of two main components: a voltage regulator 12 and a voltage booster 14. The voltage regulator 12 is generally coupled to a memory array 16. The memory array 16 being comprised of a plurality of memory cells 18 arranged in columns and rows. In the preferred embodiment of the present invention, the memory array 16 is an Erasable Programmable Read Only Memory (EPROM) memory device.

The voltage regulator 12 is used for charging a desired row of the memory array 16 to a supply voltage $V_{DD}$. If the supply voltage is greater than the maximum programmed threshold voltage, once the row voltage is charged to the supply voltage level, the voltage regulator 12 will clamp the desired row to be read at a voltage level that is no higher than the minimum programmed threshold voltage of the memory cell 18 (see FIG. 2A). What is unique about the voltage regulator 12 is that it performs the above functions while consuming no DC current.

The voltage regulator 12 is comprised of two sections: a regulating circuit 20 and a clamping circuit 22. The regulating circuit 20 is used for charging a desired row of the memory array 16 to a supply voltage $V_{DD}$. The regulating circuit 16 is basically comprised of a switch 24 which is coupled to a power supply $V_{DD}$ and to the memory array 16. The switch 24 is used for allowing the power supply $V_{DD}$ to charge the desired row of the memory array 16 to the supply voltage $V_{DD}$. The switch 24 will be activated and deactivated by a clock signal 26 during a read.

In the embodiment depicted in FIG. 1, the switch 24 is a PMOS transistor. The PMOS transistor switch 24 will have drain, gate, and source terminals. The source terminal of the PMOS transistor switch 24 is coupled to the voltage supply $V_{DD}$. The gate terminal of the PMOS transistor switch 24 is coupled to the clock signal 26. The drain terminal of the PMOS transistor switch 24 is coupled to the clamping circuit 22.

The clamping circuit 22 is used for clamping the desired row of the memory array 16 at a voltage level no higher than the maximum programmed threshold voltage of the memory cell 18. The clamping circuit 22 has a PMOS transistor 28 having drain, gate, and source terminals. The source terminal of the PMOS transistor 28 is coupled to the memory array 16 (i.e., the X-decoder power supply of the desired row of the memory array 16 to be read). The gate terminal of the PMOS transistor 28 is coupled to a reference voltage source 32. The reference voltage source 32 is used to limit the voltage of the desired row of the memory array 16 to be read to a voltage level no higher than a minimum programmed threshold voltage of a memory cell 18. The drain terminal of the PMOS transistor 28 is coupled to an NMOS transistor 30. The NMOS transistor 30 also has drain, gate, and source terminals. The drain terminal of the NMOS transistor 30 is coupled to the drain terminal of the PMOS transistor 28. The gate terminal of the NMOS transistor 30 is coupled to the clock signal 26. The source terminal of the NMOS transistor 30 is coupled to ground.

Figures 2A, 2B:
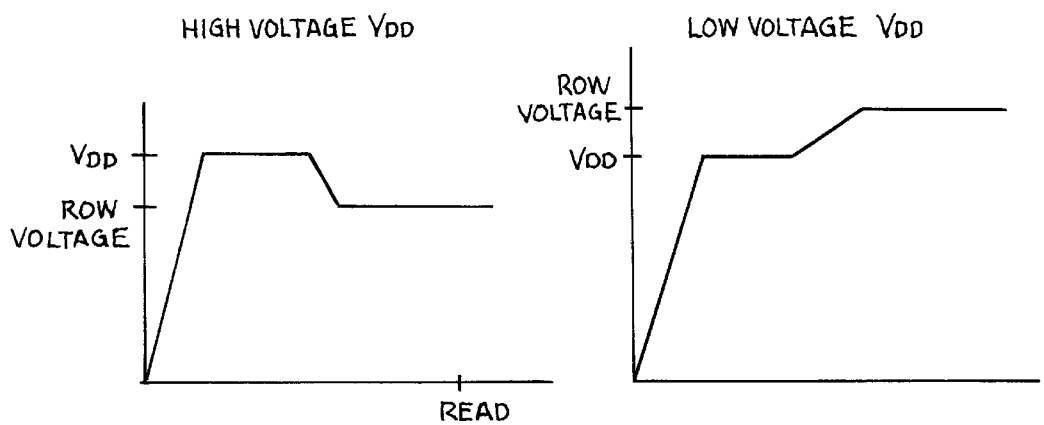
FIG. 2A is a first voltage diagram for the system depicted in FIG. 1.
FIG. 2B is a second voltage diagram for the system depicted in FIG. 1.

During a read (i.e., clock low), the row voltage goes to $V_{DD}$. When the clock goes high, the NMOS transistor 30 turns on and the row voltage goes to $V_{ref}+V_{tp}$ (See FIG. 2A). In order to read the memory cells 18 at voltage levels which are below the actual threshold voltage level of the memory array 16, a voltage booster 14 is provided. The voltage booster 14 is coupled to the voltage regulator 12 and to the memory array 16. The voltage booster 14 raises the voltage level of the desired row to a voltage above the minimum programmed threshold voltage of the memory cell 18. In the embodiment depicted in FIG. 1, the voltage booster 14 raises the voltage level of a desired row by a p-channel transistor threshold voltage level $V_{tp}$ higher than $V_{DD}$ (FIG. 2B).

The booster circuit 14 uses a delay circuit 33 for delaying the raising of the voltage of the desired row of the memory array 16. A buffering circuit is coupled to the delay circuit 33 for cleaning the signal entering and exiting the delay circuit 33. The signal that exits the delay circuit 33, once the signal is run through the buffer circuit, is used to charge a capacitor 38. The capacitor 38 is coupled to the desired row of the memory array 16 to be read through the X-decoder 40.

The capacitor 38 is used for storing a charge to raise the voltage level of the desired row of the memory array 16 to a voltage above the maximum erased threshold voltage. In the preferred embodiment of the present invention, the capacitor 38 is sized so that it is comparable to the line capacitance of the desired row of the memory array 16 to be read.

In the embodiment depicted in FIG. 1, the buffer circuit uses two inverters 34 and 36. The first inverter 34 has an input coupled to the PMOS transistor switch 24 and an output coupled to the delay circuit 33. The first inverter 34 is used for cleaning the signal entering the delay circuit 33. The second inverter 36 has an input coupled to an output of the delay circuit 33 and an output coupled to the capacitor 38. The second inverter buffers the signal exiting the delay circuit 33 and sends this signal to the capacitor 38 in order to charge the capacitor 38 and to raise the voltage of the desired row of the memory array 16 to a level above the maximum erased threshold voltage of the memory cell 18.

OPERATION

The system 10 will operate in one of two modes: a low voltage mode where $V_{ref}=V_{DD}$, and a high voltage mode where $V_{ref}<V_{DD}$. In a low voltage mode where $V_{ref}=V_{DD}$, when the clock signal goes low, the PMOS transistor switch 24 will be activated. The row voltage $V_{row}$ of the memory array 16 will be charged to the supply voltage $V_{DD}$. The other side of the capacitor 38 is held at 0 volts. When the clock signal is changed to a high state, the PMOS transistor switch 24 is deactivated and the NMOS transistor 30 is activated. This leaves the voltage of the row $V_{row}$ floating, since the PMOS transistor 28 is off, as long as $V_{DD}$ is at or below $V_{ref}$. After some delay, as determined by the delay circuit 33 and the inverters 34 and 36, the capacitor voltage will swing from 0 to $V_{DD}$ volts. This will attempt to put an addition $V_{DD}$ volts on the row voltage $V_{row}$. However, since the clamping circuit 22 is on, the row voltage ($V_{ROW}$) can go up until the PMOS transistor 28 is activated (i.e., turns on). This is one $V_{tp}$ above $V_{DD}$. Thus, the row voltage $V_{row}$ will be equal to $V_{DD}+V_{tp}$ thereby allowing reading of a memory cell 18 at much lower operating voltages (FIG. 2B).

In a high voltage mode where $V_{ref}<V_{DD}$, when the clock signal goes low, the PMOS transistor switch 24 will again be activated. The row voltage $V_{row}$ of the memory array 16 will be charged to the supply voltage $V_{DD}$. The other side of the capacitor 38 is held at 0 volts. When the clock signal is changed to a high state, the PMOS transistor switch 24 is deactivated and the NMOS transistor 30 is activated. However, the PMOS transistor 28 is now activated since $V_{ref}$ is less than the supply voltage $V_{DD}$. Thus, the row voltage $V_{row}$ is clamped to a standard value $V_{ref}+V_{tp}$. When the voltage boost is attempted, the energy is dumped directly into the clamping circuit 22 and dissipated to ground. Thus, the voltage boost does not effect normal read operations.

A unique feature of the present invention is that no additional circuitry is required to determine if one is operating in a low voltage mode or a high voltage mode. The voltage boost will automatically work at low voltages and be shunted to ground at high voltages.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A system for reading a memory cell of a memory array at voltages lower than a threshold voltage of said memory array comprising, in combination:

a voltage regulator coupled to said memory array for charging a desired row of said memory array to a supply voltage and for clamping said desired row at a voltage no higher than a maximum programmed threshold voltage of said memory cell while consuming no DC current; and a voltage booster coupled to said voltage regulator and to said memory array for raising said voltage of said desired row to a voltage above a maximum erased threshold voltage of said memory cell.

2. A system for reading a memory cell of a memory array in accordance with claim 1 wherein said voltage booster comprises:

a delay circuit for delaying the raising of said voltage of said desired row;

a buffering device coupled to said delay circuit for cleaning a signal entering and exiting said delay circuit; and a capacitor coupled to said desired row of said memory array for storing a charge to raise said voltage of said desired row to said voltage above said maximum erased threshold voltage.

3. A system for reading a memory cell of a memory array in accordance with claim 2 wherein said buffering device comprises:

a first inverter having an input coupled to said regulator and an output coupled to said delay circuit for cleaning said signal entering said delay circuit; and a second inverter having an input coupled to said delay circuit and an output coupled to said capacitor for sending a signal to charge said capacitor to raise said voltage of said desired row.

4. A system for reading a memory cell of a memory array in accordance with claim 2 wherein said capacitor is sized comparable to a line capacitance of said desired row of said memory array.

5. A system for reading a memory cell of a memory array in accordance with claim 1 wherein said voltage regulator comprises:

a regulating circuit for charging said desired row of said memory array to said supply voltage; and a clamping circuit coupled to said regulating circuit for clamping said desired row at said voltage no higher than said maximum programmed threshold voltage of said memory cell.

6. A system for reading a memory cell of a memory array in accordance with claim 5 wherein said regulating circuit comprises:

a voltage supply for generating said supply voltage;

a switch coupled to said voltage supply and to said memory array for coupling said voltage supply to said desired row of said memory array; and signal source coupled to said switch for activating and deactivating said switch.

7. A system for reading a memory cell of a memory array in accordance with claim 6 wherein said switch is a transistor having drain, gate, and source terminals wherein said drain terminal is coupled to said desired row of said memory array, said gate is coupled to said signal source, and said source is coupled to said power source.

8. A system for reading a memory cell of a memory array in accordance with claim 7 wherein said transistor is a PMOS transistor.

9. A system for reading a memory cell of a memory array in accordance with claim 5 wherein said clamping circuit comprises:
- a first transistor having drain, gate, and source terminals wherein said source terminal is coupled to said desired row;
- a reference voltage source coupled to said gate of said first transistor for limiting said voltage of said desired row to a voltage no higher than a maximum programmed threshold voltage of said memory cell; and
- a second transistor having drain, gate, and source terminals wherein said drain terminal is coupled to said drain terminal of said first transistor, said source terminal is coupled to said regulating circuit and said source terminal is coupled to ground.

10. A system for reading a memory cell of a memory array in accordance with claim 9 wherein said first transistor is a PMOS transistor.

11. A system for reading a memory cell of a memory array in accordance with claim 9 wherein said second transistor is a NMOS transistor.

12. A system for reading a memory cell of a memory array in accordance with claim 1 wherein said memory array is an erasable programmable read only memory (EPROM) device.

13. A system for reading a memory cell of a memory array at voltages lower than a threshold voltage of said memory array comprising, in combination:
- a voltage regulator coupled to said memory array for charging a desired row of said memory array to a supply voltage and for clamping said desired row at a voltage no higher than a maximum programmed threshold voltage of said memory cell while consuming no DC current, said voltage regulator comprising:
  - a regulating circuit for charging said desired row of said memory array to said supply voltage; and
  - a clamping circuit coupled to said regulating circuit for clamping said desired row at said voltage no higher than said maximum programmed threshold voltage of said memory cell; and
- a voltage booster coupled to said voltage regulator and to said memory array for raising said voltage of said desired row to a voltage above a maximum erased threshold voltage of said memory cell, said voltage booster comprising:
  - a delay circuit for delaying the raising of said voltage of said desired row;
  - a buffering device coupled to said delay circuit for cleaning a signal entering and exiting said delay circuit; and
  - a capacitor coupled to said desired row of said memory array for storing a charge to raise said voltage of said desired row to said voltage above said maximum erased threshold voltage.

14. A system for reading a memory cell of a memory array in accordance with claim 13 wherein said buffering device comprises:
- a first inverter having an input coupled to said regulator and an output coupled to said delay circuit for cleaning said signal entering said delay circuit; and
- a second inverter having an input coupled to said delay circuit and an output coupled to said capacitor for sending a signal to charge said capacitor to raise said voltage of said desired row.

15. A system for reading a memory cell of a memory array in accordance with claim 13 wherein said capacitor is sized comparable to a line capacitance of said desired row of said memory array.

16. A system for reading a memory cell of a memory array in accordance with claim 13 wherein said regulating circuit comprises:
- a voltage supply for generating said supply voltage;
- a switch coupled to said voltage supply and to said memory array for coupling said voltage supply to said desired row of said memory array; and
- signal source coupled to said switch for activating and deactivating said switch.

17. A system for reading a memory cell of a memory array in accordance with claim 16 wherein said switch is a transistor having drain, gate, and source terminals wherein said drain terminal is coupled to said desired row of said memory array, said gate is coupled to said signal source, and said source is coupled to said voltage reference generator.

18. A system for reading a memory cell of a memory array in accordance with claim 17 wherein said transistor is a PMOS transistor.

19. A system for reading a memory cell of a memory array in accordance with claim 13 wherein said clamping circuit comprises:
- a first transistor having drain, gate, and source terminals wherein said source terminal is coupled to said desired row;
- a reference voltage source coupled to said gate of said first transistor for limiting said voltage of said desired row to a voltage no higher than a maximum programmed threshold voltage of said memory cell; and
- a second transistor having drain, gate, and source terminals wherein said drain terminal is coupled to said drain terminal of said first transistor, said source terminal is coupled to said regulating circuit and said source terminal is coupled to ground.

20. A system for reading a memory cell of a memory array in accordance with claim 19 wherein said first transistor is a PMOS transistor.

21. A system for reading a memory cell of a memory array in accordance with claim 19 wherein said second transistor is a NMOS transistor.

22. A system for reading a memory cell of a memory array in accordance with claim 13 wherein said memory array is an erasable programmable read only memory (EPROM) device.

23. A system for reading a memory cell of a memory array at voltages lower than a threshold voltage of said memory array comprising, in combination:
- a voltage regulator coupled to said memory array for charging a desired row of said memory array to a supply voltage and for clamping said desired row at a voltage no higher than a maximum programmed threshold voltage of said memory cell while consuming no DC current, said voltage regulator comprising:
  - a regulating circuit for charging said desired row of said memory array to said supply voltage, said regulating circuit comprising:
    - a voltage supply for generating said supply voltage;
    - a switch coupled to said voltage supply and to said memory array for coupling said voltage supply to said desired row of said memory array; and
    - signal source coupled to said switch for activating and deactivating said switch; and a clamping circuit coupled to said regulating circuit for clamping said desired row at said voltage no higher than said maximum programmed threshold voltage of said memory cell, said clamping circuit comprising:
  a PMOS transistor having drain, gate, and source terminals wherein said source terminal is coupled to said desired row;
  a reference voltage source coupled to said gate of said first transistor for limiting said voltage of said desired row to a voltage no higher than a maximum programmed threshold voltage of said memory cell; and
  an NMOS transistor having drain, gate, and source terminals wherein said drain terminal is coupled to said drain terminal of said first transistor, said source terminal is coupled to said regulating circuit and said source terminal is coupled to ground; and
a voltage booster coupled to said voltage regulator and to said memory array for raising said voltage of said desired row to a voltage above said maximum erased threshold voltage of said memory cell, said voltage booster comprising:
  a delay circuit for delaying the raising of said voltage of said desired row;
  a buffering device coupled to said delay circuit for cleaning a signal entering and exiting said delay circuit, said buffering device comprising:
    a first inverter having an input coupled to said regulator and an output coupled to said delay circuit for cleaning said signal entering said delay circuit; and
    a second inverter having an input coupled to said delay circuit and an output coupled to said capacitor for sending a signal to charge said capacitor to raise said voltage of said desired row; and
  a capacitor coupled to said desired row of said memory array for storing a charge to raise said voltage of said desired row to said voltage above said maximum erased threshold voltage, said capacitor being sized comparable to a line capacitance of said desired row of said memory array.

24. A system for reading a memory cell of a memory array in accordance with claim 23 wherein said switch is a PMOS transistor having drain, gate, and source terminals wherein said drain terminal is coupled to said desired row of said memory array, said gate is coupled to said signal source, and said source is coupled to said voltage reference generator.

25. A system for reading a memory cell of a memory array in accordance with claim 23 wherein said memory array is an erasable programmable read only memory (EPROM) device.

* * * * *